United States Patent
Subrahmanyan et al.

(10) Patent No.: US 6,693,030 B1
(45) Date of Patent: *Feb. 17, 2004

(54) REACTIVE PRECLEAN PRIOR TO METALLIZATION FOR SUB-QUARTER MICRON APPLICATION

(75) Inventors: Suchitra Subrahmanyan, Sunnyvale, CA (US); Liang-Yuh Chen, Foster City, CA (US); Roderick Craig Mosely, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/617,522

(22) Filed: Jul. 14, 2000

Related U.S. Application Data

(63) Continuation of application No. 09/000,746, filed on Dec. 30, 1997, now Pat. No. 6,107,192.

(51) Int. Cl.[7] .......................................... H01L 21/4763
(52) U.S. Cl. ...................................... 438/637; 438/687
(58) Field of Search ................................ 438/654, 655, 438/475, 683, 643, 653, 694, 727

(56) References Cited

U.S. PATENT DOCUMENTS

| | | | | |
|---|---|---|---|---|
| 5,143,748 A | * | 9/1992 | Ishikawa et al. | ............ 427/569 |
| 5,248,636 A | * | 9/1993 | Davis et al. | ................. 438/709 |

(List continued on next page.)

FOREIGN PATENT DOCUMENTS

| | | | | |
|---|---|---|---|---|
| EP | 0305946 A2 | | 3/1989 | .............. G03F/7/26 |
| EP | 0518774 A1 | | 12/1992 | ............. C23G/5/00 |
| EP | 0680070 A1 | | 11/1995 | ............. H01J/37/32 |
| GB | 2300517 A | * | 6/1996 | ............ H01L/21/28 |
| JP | 669168 | | 3/1994 | ......... H01L/21/302 |

OTHER PUBLICATIONS

PCT International Search Report dated Mar. 15, 1999.
Awaya, N., et al., "Evaluation of a Copper Metallization Process and the Electrical Characteristics of Copper–Interconnected Quarter–Micron CMOS," IEEE Transactions On Electron Devices, vol. 43, No. 8, p. 1206–1211, Aug. 1996.
Yasuda, T., et al., "Dual–function remote plasma etching/cleaning system applied to selective etching of SiO2 and removal of polymeric residues," Journal of Vacuum Science & Technology, Sep./Oct., No. 5, p. 2496–2507, 1993.
Yasushi Sawada, et al., "The Reduction of Copper Oxide Thin Films With Hydrogen Plasma Generated By An Atmospheric–Pressure Glow Discharge," J. Phys. D: Appl. Phys. 29 (1996), p. 2539–2544.

(List continued on next page.)

*Primary Examiner*—Hoai Ho
*Assistant Examiner*—David Vu
(74) *Attorney, Agent, or Firm*—Moser, Patterson & Sheridan, LLP

(57) ABSTRACT

The present invention generally provides a precleaning process prior to moralization for submicron features on substrates. The method includes cleaning the submicron features with radicals from a plasma of a reactive gas such as oxygen, a mixture of $CF_4/O_2$, or a mixture of $He/NF_3$, wherein the plasma is preferably generated by a remote plasma source and the radicals are delivered to a chamber in which the substrate is disposed. Native oxides remaining in the submicron features are preferably reduced in a second step by treatment with radicals from a plasma containing hydrogen. Following the first or both precleaning steps, the features can be filled with metal by available moralization techniques which typically include depositing a barrier/liner layer on exposed dielectric surfaces prior to deposition of aluminum, copper, or tungsten. The precleaning and moralization steps can be conducted on available integrated processing platforms.

59 Claims, 4 Drawing Sheets

U.S. PATENT DOCUMENTS

| | | | |
|---|---|---|---|
| 5,306,671 A | * 4/1994 | Ogawa et al. | 438/595 |
| 5,403,434 A | 4/1995 | Moslehi | 156/643 |
| 5,508,066 A | * 4/1996 | Akahori | 427/571 |
| 5,545,289 A | 8/1996 | Chen et al. | 156/643.1 |
| 5,545,592 A | 8/1996 | Iacoponi | 437/200 |
| 5,627,105 A | * 5/1997 | Delfino et al. | 438/627 |
| 5,660,682 A | 8/1997 | Zhao et al. | 438/715 |
| 5,681,780 A | 10/1997 | Mihara et al. | 437/228 |
| 5,726,097 A | * 3/1998 | Yanagida | 438/622 |
| 5,834,371 A | * 11/1998 | Ameen et al. | 438/656 |
| 5,885,361 A | * 3/1999 | Kikuchi et al. | 134/1.1 |
| 5,935,874 A | 8/1999 | Kennard | 438/710 |
| 6,015,761 A | * 1/2000 | Merry et al. | 438/727 |
| 6,107,192 A | * 8/2000 | Subrahmanyan et al. | 438/637 |
| 6,132,564 A | * 10/2000 | Licata | 204/192.15 |
| 6,395,150 B1 | 5/2002 | Van Cleemput et al. | 204/192.37 |

OTHER PUBLICATIONS

Tetsuya Taguwa, et al., "Low Contact Resistance Metallization for Gigabit Scale DRAM's Using Fully–Dry Cleaning by Ar/Hz ECR Plasma," IEEE Transactions on Electon Devices, vol. 44, No. 4, Apr. 1997, p. 588–593.

* cited by examiner

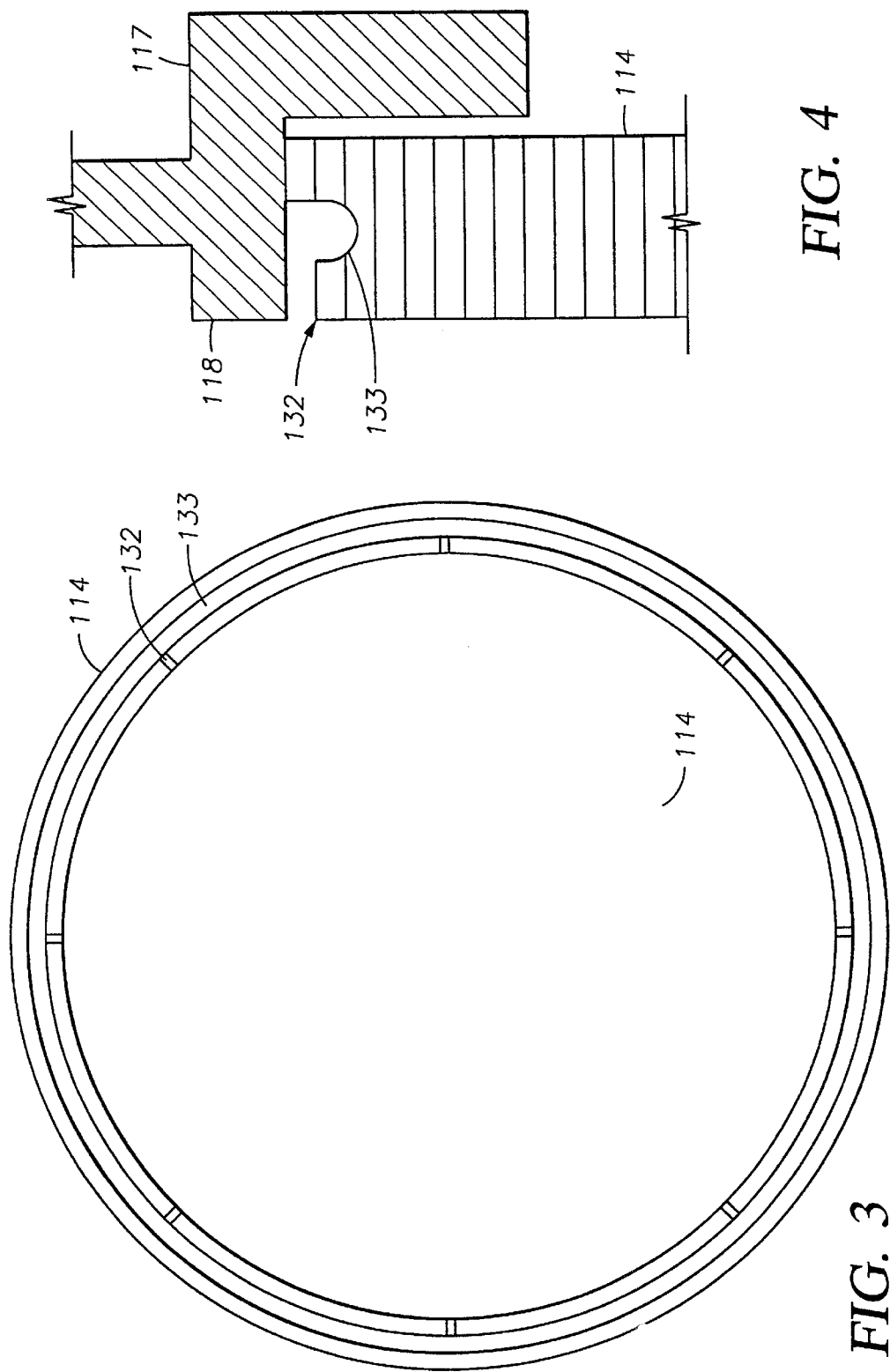

REACTIVE PRECLEAN PRIOR TO METALLIZATION FOR SUB-QUARTER MICRON APPLICATION

This is a continuation of application Ser. No. 09/000,746, filed Dec. 30, 1997 now U.S. Pat. No. 6,107,192.

BACKGROUND OF THE INVENTION

1. Field of the Invention

The present invention relates to a moralization method for manufacturing semiconductor devices. More particularly, the present invention relates to precleaning of submicron features prior to moralization.

2. Background of the Related Art

Sub-half micron multilevel moralization is one of the key technologies for the next generation of very large scale integration (VIS). The multilevel interconnects that lie at the heart of this technology require polarization of interconnect features formed in high aspect ratio apertures, including contacts, vias, lines or other features. Reliable formation of these interconnect features is very important to the success of VLSI and to the continued effort to increase circuit density and quality on individual substrates and die.

The increase in circuit densities primarily results from a decrease in the widths of vias, contacts and other features as well as a decrease in the thickness of dielectric materials between these features. Cleaning of the features to remove contaminants prior to moralization is required to improve device integrity. The decrease in width of the features results in larger aspect ratios for the features and increased difficulty in cleaning the features prior to filling the features with metal or other materials. Failure to clean the features can result in void formation within the features or an increase in the resistance of the features. Therefore, there is a great amount of ongoing effort being directed at cleaning small features having high aspect ratios, especially where the ratio of feature height to width is 4:1 or larger.

The presence of native oxides and other contaminants within a small feature typically results in voids by promoting uneven distribution of the depositing metal. The native oxide typically forms as a result of exposing the exposed film layer/substrate to oxygen. Oxygen exposure occurs when moving substrates between processing chambers at atmospheric conditions, or when the small amount of oxygen remaining in a vacuum chamber contacts the wafer/film layer, or when a layer is damaged by etching. Other contaminants within the features can be sputtered material from an oxide over-etch, residual photoresist from a stripping process, leftover polymer from a previous oxide etch step, or redeposited material from a preclean sputter etch process. The native oxide and other contaminants create regions on the substrate which interfere with film formation, by creating regions where film growth is stunted. Regions of increased growth merge and seal the small features before regions of limited growth can be filled with the depositing metal.

The presence of native oxides and other contaminants also can increase the via/contact resistance and can reduce the electro migration resistance of small features. The contaminants can diffuse into the dielectric layer, the sublayer, or the deposited metal and alter the performance of devices which include the small features. Although contamination may be limited to a thin boundary region within the features, the thin boundary region is a substantial part of the small features. The acceptable level of contaminants in the features decreases as the features get smaller in width.

Precleaning of features using sputter etch processes is effective for reducing contaminants in large features or in small features having aspect ratios smaller than about 4:1. However, sputter etch processes can damage silicon layers by physical bombardment, sputter deposit $Si/SiO_2$ onto sidewalls of the features, and sputter metal sublayers, such as aluminum or copper, onto sidewalls of the features. For larger features, the sputter etch processes typically reduce the amount of contaminants within the features to acceptable levels. For small features having larger aspect ratios, sputter etch processes have not been as effective in removing contaminants within the features, thereby compromising the performance of the devices which are formed.

Preclean by sputter etch process is particularly unsuitable for features with copper substrate. It is because of the ease of diffusion of sputtered Cu through the dielectric sidewalls. This diffusion is especially true for TEOS, thermal oxide and some low K dielectric materials. Therefore, a new preclean process without any bias on the substrate is needed for a Cu preclean application.

Wet chemical cleaning processes have been developed to clean submicron features prior to moralization without the damage or contamination seen in sputter etch processes. The wet chemical processes typically include treatment of the feature with hydrofluoric acid (HF) to remove native oxides. Various other wet chemical processes can be used depending on the contaminants remaining in the features. The wet chemical cleaning processes can be combined with dry cleaning processes. However, the addition of wet chemical cleaning steps to remove trace amounts of contaminants from the features substantially increases the overall process time for moralization.

A soft etch cleaning process for submicron features is described by Sumi et al., "New Contact Process Using Soft Etch for Stable Ohmic Characteristics and its Application to 0.1 micron CMOS Devices", IEDM 94-113 et seq. The soft etch process uses an inductively coupled plasma of argon to remove native oxides from a silicon underlayer. The process does not avoid resputtering of materials from the bottom to the sidewalls of the contact hole.

A dry cleaning process for submicron features is described by Taguwa et al., "Low-Contact Resistance Moralization for Gigabit Scale DRAMs Using Fully-Dry Cleaning by $Ar/H_2$ ECR Plasma", IEDM 95-695 et seq. The dry cleaning process preferably cleans the features with an Electron Cyclotron Plasma containing a mixture of argon and hydrogen prior to chemical vapor deposition of titanium. The cleaning process reduces bombardment by Ar, removes native oxides from a silicon underlayer, and promotes formation of a uniform $TiSi_x$ layer between the silicon underlayer and the deposited titanium. However, addition of $H_2$ to Ar in the cleaning process does not completely eliminate resputtering of materials within the features.

For sub-quarter micron features having high aspect ratios, resputtering of material from the bottom to the sidewalls of the feature during dry cleaning results in a significant narrowing of the feature and a corresponding increase in resistance of the feature which impairs device performance. The known dry cleaning processes are not effective in removing contaminants from the features without redepositing material on the sidewalls of the features. Therefore, there remains a need for a cleaning process for small features which effectively cleans the feature without leaving contaminants in the feature.

SUMMARY OF THE INVENTION

The present invention provides a method for precleaning features on a semiconductor substrate to remove contaminants prior to moralization. The method includes removal of oxides from the bottom of contacts without damaging the underlying layer, including the removal of $SiO_2$, aluminum oxide or copper oxide from the bottom of vias without redeposition of the material onto sidewalls, the removal of a thin layer of damaged silicon from the bottom of contact holes, and the removal of contaminants from the sidewalls of the features. The precleaning of the features preferably includes a first step wherein contaminants are removed with radicals from a remote plasma of a reactive cleaning gas, and an optional second step wherein native oxides remaining in the features are reduced by exposure to hydrogen radicals. The plasma of the cleaning gas is preferably generated by a remote plasma source to provide a soft etch which does not damage or resputter the sublayers at the bottom of the features.

Following the first or both precleaning steps, the features can be filled with metal by available techniques which typically include depositing a barrier/liner layer on the exposed dielectric surfaces using physical vapor deposition, chemical vapor deposition, or other techniques, prior to deposition of a metal such as aluminum (Al), copper (Cu), or tungsten (W) to completely fill the feature. The precleaning and moralization steps can be conducted on available integrated processing platforms such as the Endura® system available from Applied Materials, Inc., Santa Clara, Calif.

In one aspect of the invention, submicron features formed in a dielectric layer on a semiconductor substrate are processed by precleaning the submicron features with radicals from a plasma comprising a reactive gas such as oxygen, a mixture of $CF_4/O_2$, or a mixture of $He/NF_3$, wherein the plasma is generated by a remote plasma source and neutral radicals are delivered into a chamber containing the substrate. Subsequent to cleaning with the reactive gas, native oxides remaining in the submicron features are removed with radicals from a plasma comprising hydrogen alone or in mixtures with nitrogen (N), argon (Ar), or helium (He). The hydrogen radicals also remove carbon and fluorine contaminants in addition to oxides. Following precleaning, a liner or barrier layer is preferably deposited on exposed surfaces of the feature, and the feature is then filled with Al, Cu, W, or other conductive material. When the liner or barrier layer is Ti or Ti/TiN, deposition of the titanium at 650–750° C. on a silicon surface precleaned according to the present invention forms a uniform, one phase layer of $TiSi_x$. Precleaning can also be performed in situ in a CVD TiN chamber which deposits a barrier layer for copper or aluminum moralization by addition of a remote plasma source to the chamber.

In another aspect of the invention, precleaning according to the present invention can be performed both before and after deposition of a barrier layer to reduce the amount of contaminants on both sides of the barrier layer and improve the electro migration resistance of the feature.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 3 is a schematic top view in section along lines 3—3 of FIG. 2 showing the gas distribution system;

FIG. 4 is a schematic enlarged view showing the gas distribution system of FIG. 2;

DETAILED DESCRIPTION OF A PREFERRED EMBODIMENT

Figure 1:
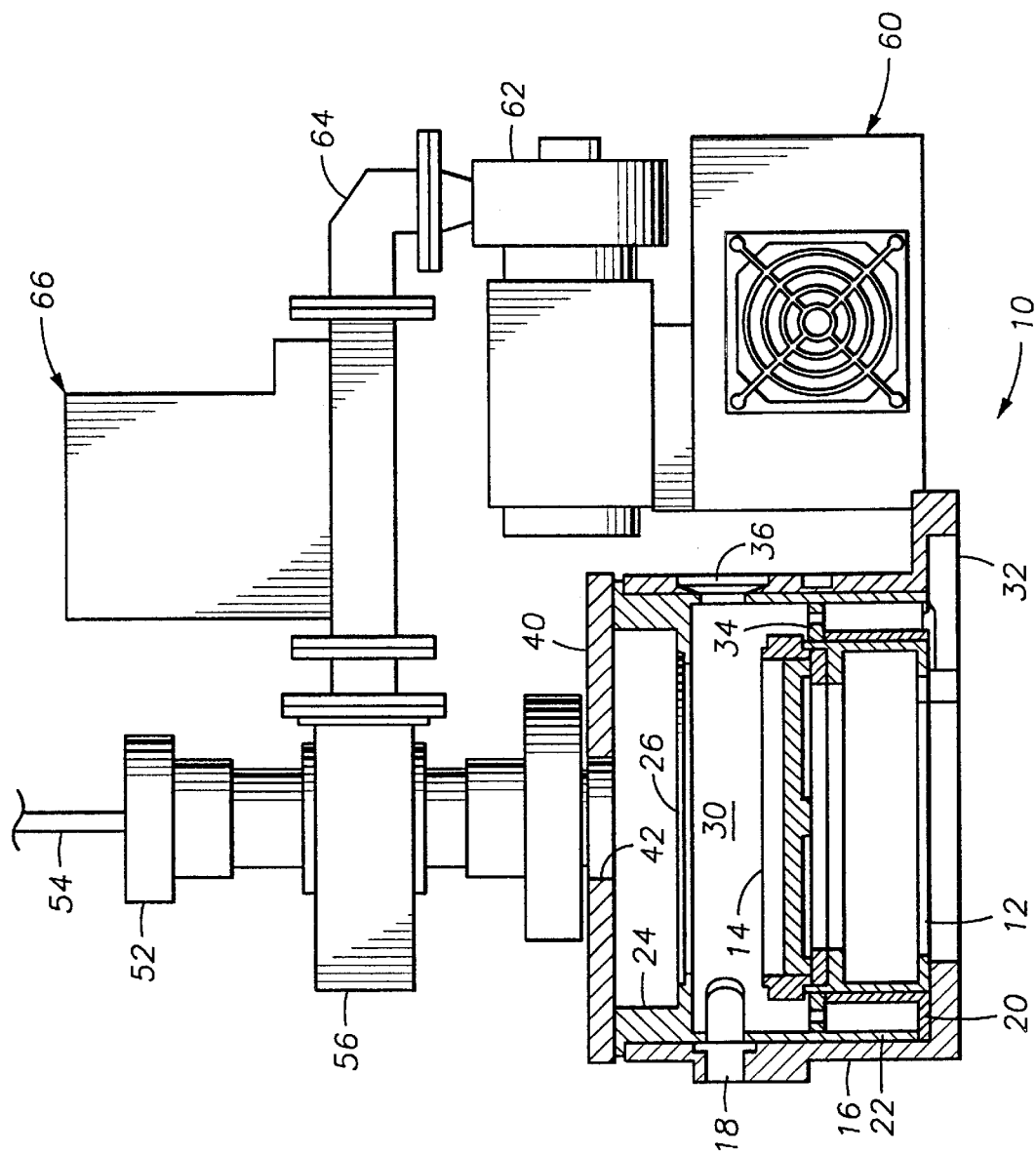
FIG. 1 shows a reactive preclean chamber which receives a remote plasma source to conduct the precleaning steps of the present invention.

The present invention generally provides a method of precleaning features etched into a dielectric layer on a semiconductor substrate, the method comprising the steps of precleaning the submicron features with radicals from a plasma comprising a reactive gas, wherein the plasma is preferably generated by a remote plasma source and neutral radicals are delivered into a chamber having the substrate disposed therein. Native oxides remaining in the submicron features after remote plasma treatment are preferably reduced by reaction with hydrogen prior to moralization of the feature. More particularly, the present invention provides precleaning of the submicron features and filling of the features with a metal such as copper, aluminum, or tungsten. The process steps can be combined in an integrated processing system, such as the Endura® system available from Applied Materials, Inc., Santa Clara, Calif., although non-integrated techniques can be used to clean and fill submicron features in accordance with the present invention.

For clarity, the present invention will be described below with reference to both copper and aluminum deposition techniques. However, tungsten or other metal deposition processes may be used to accomplish the advantages of the present invention, whether presently known or yet to be discovered.

The invention provides a suitable method for precleaning vias, contacts, and other features etched into a dielectric layer, such as a silicon dioxide layer, which is deposited on a conductive or semi-conductive sublayer, such as Ge, Si, Al, Cu, or TiN sublayers. The feature typically exposes the sublayer so that the feature can be filled with a conductive or semi-conductive material which connects the sublayer and a subsequent metal interconnect layer to be deposited on the dielectric layer. Etching of the features in the dielectric typically leaves contaminants which should be removed to improve filling of the features and ultimately improve the integrity and reliability of the devices formed.

After etching of the dielectric layer, the features can have damaged silicon or metal residues within the features from over-etching of the dielectric layer. The features can also contain residual photoresist on the feature surfaces from the photoresist stripping and/or ashing process or residual polymer from the dielectric etch step. The features may also contain redeposited material on the feature surfaces following a sputter etch preclean process. These contaminants can migrate into the dielectric layer or can interfere with the selectivity of moralization by promoting uneven distribution of the depositing metal. The presence of the contaminants also can increase the resistance of the deposited metal by substantially narrowing the width of the feature, and thus creating a narrowed portion in the metal forming the via, contact line, or other conductive feature.

The submicron features which are cleaned and filled in accordance with the present invention, are formed by conventional techniques which deposit a dielectric material over a surface on a semiconductor substrate. Any dielectric material, whether presently known or yet to be discovered, may be used and is within the scope of the present invention, including low dielectric materials such as organic polymers and aerogels. The dielectric layer may comprise one or more distinct layers and may be deposited on any suitable deposition enhancing sublayer. The preferred deposition enhancing sublayers include conductive metals such as Al and Cu, barrier surfaces such as TiN, and doped silicon.

Once deposited, the dielectric layer is etched by conventional techniques to form vias, contacts, trenches or other submicron features. The features will typically have a high aspect ratio with steep sidewalls. Etching of the dielectric layer may be accomplished with any dielectric etching process, including plasma etching. Specific techniques for etching silicon dioxide include such compounds as buffered hydrofluoric acid and acetone. However, patterning may be accomplished on any layer using any method known in the art.

A Preferred Precleaning Apparatus

The precleaning process of the present invention is preferably conducted on a remote plasma source (RPS) chamber such as the Etch RPS chamber which is available from Applied Materials, Inc., Santa Clara, Calif. The chamber comprises two major assemblies: 1) a chamber body, preferably, but not necessarily, including an electrostatic chuck which supports and secures a substrate in the chamber; and 2) a remote plasma source. These major assemblies will be discussed separately for the sake of organization, although it will be understood that in reality there is dynamic interaction between these assemblies. In a RPS chamber, reactive H radicals are formed by the remote source and are introduced into the neighborhood of the substrate as primarily neutral species, i.e., not having an electric charge and therefore not an ion, thereby preventing generation of self bias and bombardment of the wafer surface by ions. Experiments with RPS chambers show that a 2.45 GHz microwave source is more efficient and can generate more hydrogen radicals than lower frequency RF sources.

Chamber Body/Electrostatic Chuck Assembly

Referring to FIG. 1, features etched on a substrate are precleaned in a remote plasma source (RPS) chamber 10 having a fixed cathode 12 which includes an electrostatic chuck 14 that secures the substrate (not shown) to the fixed cathode 12. The chamber 10 includes a chamber body 16 having a slit valve port 18 which connects the chamber 10 to a substrate processing platform such as the Endura® platform.

The fixed cathode 12 is shielded from process gases by a cathode liner 20 which has a non-stick outer surface to enhance process performance. The chamber body 16 is also shielded from process gases by a chamber liner 22 which has a non-stick inner surface to enhance process performance. The chamber liner 22 includes an inner annular ledge 24 which supports a gas distribution plate 26. The gas distribution plate 26 has a plurality of spaced holes which distribute process gases received from a remote plasma source described below. The process gases flow over the surface of a substrate positioned on the electrostatic chuck 14. The remote plasma source typically confines any plasma of the process gases and provides neutral radicals to the chamber 22. The gas distribution plate may be grounded to further reduce ions remaining in the process gases.

A processing region 30 above the fixed cathode 12 is maintained at a low process pressure by vacuum pumps (not shown) which are in fluid communication with an exhaust port 32 on the chamber body 16. A plenum 34 having a plurality of spaced holes separates the processing region 30 from the exhaust port 32 to promote uniform exhausting around the fixed cathode 12. The processing region 30 is visible from outside the chamber 10 through a sapphire window 36 which is sealed in the chamber body 16.

The chamber 10 has a removable chamber lid 40 which rests on the chamber liner 22. The chamber lid 40 has a central injection port 42 which receives process gases from a remote plasma source 50 described below.

Remote Plasma Source

Referring to FIG. 1, process gases for the precleaning process of the present invention are excited into a plasma within a remote plasma source 50 which is in fluid communication with the RPS chamber 10 described above. A plasma applicator 52 has a gas inlet 54 which receives process gases. The process gases flow through the applicator 52 and exit into the central injection port 42 in the chamber lid 40. A jacket waveguide 56 surrounds a sapphire tube portion of the plasma applicator 52 and supplies microwave energy to the process gases. The plasma is generated in the applicator 52 and is typically confined to the applicator 52.

Microwave energy is generated by a magnetron 60 which provides up to 1500 watts at 2.45 GHz. The microwave energy passes through a microwave isolator 62 which prevents reflected power from damaging the magnetron 60. The microwave energy from the isolator 62 is transmitted through a 90° waveguide 64 to an autotuner 66 which automatically adjusts the impedance of the plasma in the applicator 52 to the impedance of the magnetron 60 resulting in minimum reflected power and maximum transfer of power to the plasma applicator 52.

The process gases receive sufficient energy in the applicator 52 to form a plasma containing reactive (radical) species. A plasma of $CF_4$ and $O_2$ generates O radicals and some F radicals. The process gases are mostly neutralized before leaving the applicator 52. The process gases retain a substantial portion of the radicals after passing through the distribution plate 26. The radicals are delivered over the substrate before the process gases are exhausted from the chamber. The F radical primarily combines with Si and $SiO_2$ to form volatile $SiF_4$. The O radicals combine with fluorocarbons to form CO, $CO_2$, and $COF_2$. Hydrogen radicals react with the native oxide to form water vapor and the metal. The exhaust carries the various byproducts as well as some of the recombination species.

Although precleaning is shown for a dedicated precleaning chamber in FIG. 1, precleaning could also be done by connecting the remote plasma source to a metal CVD/PVD chamber. For example, gas inlets could be provided at the level of the substrate in such moralization chambers to deliver the reactive gas plasma or hydrogen plasma from the remote plasma source. Metal deposition chambers having gas delivery systems could be modified to deliver the precleaning gas plasma through existing gas inlets such as a gas distribution showerhead positioned above the substrate.

The Precleaning Process

The present invention provides a method for precleaning features on a semiconductor substrate to remove contaminants prior to moralization. The method includes removal of silicon dioxide from the bottom of contacts without damaging the silicon, removal of aluminum oxide or copper oxide from the bottom of vias without redeposition of the metal onto sidewalls, removal of a thin layer of silicon from the bottom of contact holes, and removal of contaminants from the sidewalls of the features.

According to the invention, features formed in a dielectric layer on a semiconductor substrate are precleaned with radicals from a plasma comprising a reactive gas such as oxygen, a mixture of $CF_4/O_2$, or a mixture of $He/NF_3$, wherein the plasma is preferably generated by a remote plasma source and delivered into a chamber in which the substrate is disposed. The preferred reactive gas is $CF_4/O_2$ which provides both oxygen ions and fluorine ions during the cleaning process. This process typically uses a high concentration of $O_2$ to form a non-polymerizing mixture for effective removal of fluorine and carbon containing species. The gas mixture can be varied to obtain a wide range of removal etch rates (50 Å/min to 500 Å/min) and a wide range of $Si:SiO_2$ etch selectivities. The cleaning process leaves native oxides in the features, and the native oxides are preferably reduced in a second step by radicals from a plasma comprising hydrogen, alone or in mixtures with N, Ar or He which function to dilute the reactive radicals. Following the first or both cleaning steps, a liner or barrier layer such as TiN or Ti is preferably deposited on exposed surfaces of the feature, and the feature is preferably filled with a conductive material such as Al, Cu, or W by PVD, CVD, or electroplating processes.

In one aspect of the invention, submicron features formed in a dielectric layer on a semiconductor or metal substrate are processed by precleaning the submicron features with radicals from a plasma comprising a $CF_4/O_2$, wherein the plasma is generated by a remote plasma source and delivered into a chamber containing the substrate. The reactive gas radicals remove residual photoresist, hydrocarbons, and fluorocarbons from the sidewalls of the features. The reactive gas radicals can also remove damaged Si on the bottom of the feature. A plasma of $CF_4/O_2$ contains both fluorine radicals and oxygen radicals. The fluorine radicals remove silicon by the formation of $SiF_4$ which is volatile under process conditions. The fluorine radicals remove silicon dioxide by formation of $SiF_4$ and CO and other oxygen compounds which are volatile under process conditions. The fluorine radicals also remove hydrogen from hydrocarbon or fluorocarbon contaminants within the feature, and assist the oxygen radicals in breaking down the hydrocarbons and fluorocarbons into volatile components. An inert gas such as helium can be provided in the plasma as desired to dilute the reactive radicals. For features having silicon sublayers, typically the first level, the fluorine radicals preferably remove damaged silicon by removing a small layer, e.g., 50 Å, of the silicon.

Subsequent to cleaning with the radicals from the plasma of the reactive gas, native oxides remaining in the submicron features can be reduced with radicals from a plasma comprising hydrogen, alone or in mixtures with N, Ar, or He. Reduction of the native oxides provides an oxygen free interface between the feature and the sublayer which reduces the resistance of the feature. Thermal reduction of the native oxides using hydrogen or hydrogen contains mixture can be achieved in a CVD TiN chamber RPS chamber at 350° C. The hydrogen surface treatment of the native oxides has an added benefit of leaving dangling hydrogen bonds on the surface of the sublayer at the bottom of the feature. The dangling hydrogen bonds help reduce subsequent films which are deposited from carbon based precursors. The hydrogen treatment in the case of a Si sublayer passivates the Si surface, and thereby makes it resistant to reoxidation when exposed to the atmosphere.

Following precleaning according to the invention, a liner or barrier layer is preferably deposited on exposed surfaces of the feature, and the feature is filled with Al, Cu, W, or other conductive material. When the liner or barrier layer is Ti or Ti/TiN, titanium deposited on a silicon surface precleaned according to the present invention forms a uniform, one phase layer of $TiSi_x$. When the liner or barrier layer is Ti or Ti/TiN, deposition of the titanium at 650–750° C. on a silicon surface precleaned according to the present invention forms the uniform, one phase layer of $TiSi_x$.

In another aspect of the invention, precleaning according to the present invention can be performed both before and after deposition of a barrier layer to increase the electro migration resistance of the deposited Al, Cu, W, or other conductive metal which fills the feature. Preferred barrier/lining layers include such layers as tantalum (Ta), tantalum nitride (TaN), titanium (Ti), and titanium nitride (TiN), or a combination of these layers. Treatment of barrier/lining layers with $H_2$ radicals generated by remote plasma or thermal processes can be used to provide better adhesion to CVD deposited Al or CVD deposited Cu. For example, treatment of Ta, TaN, or CVD deposited TiN with $H_2$ or $H_2$ gas mixture with He, Ar, or $N_2$ provides excellent adhesion to copper. The $H_2$ gas mixtures preferably comprise at least 90% by volume of $H_2$. This $H_2$ treatment of the barrier layer can also be done in situ in the metal deposition chamber (e.g., Cu) by mounting a remote plasma source to a CVD Cu chamber. This in situ treatment passivates the barrier surface and prevents adsorption of C, O, and F compounds leading to better adhesion and lower resistivity of CVD Cu on Ta, TaN, or TiN surfaces. This treatment will also improve the texture, grain orientation, and grain size of Cu on the barrier layer resulting in good surface topography and tighter distribution of grain orientations.

The precleaning method of the invention is especially useful for cleaning of submicron features having copper sublayers at the bottom of the features since copper is easily sputtered to the side walls in a conventional ICP or sputter etch based preclean chamber. The sputtered copper diffuses into the dielectric material causing device failure. The present invention cleans the via without sputtering of the base of the via.

Hypothetical Example

The following hypothetical example describes the preferred method of the present invention by describing the precleaning of features etched into a silicon dioxide layer having a copper sublayer. Precleaning includes a first step of exposing the features to radicals from a plasma of $CF_4/O_2$ which is generated in a remote plasma source. The radicals are delivered to a chamber in which a substrate having the features is disposed. A plasma comprising hydrogen is then generated to deliver H radicals to the chamber to reduce native oxides, oxides from plasma damage in a previous oxide etch step, or oxides from wet chemistry used after the etch step, prior to filling of the features with copper in a CVD plasma reactor.

The precleaning chamber is stabilized for 5 seconds at a pressure of 400 mTorr with an oxygen flow of 200 sccm and a tetrafluoromethane ($CF_4$) flow of 10 sccm prior to application of microwave power in the remote plasma source. The features are then cleaned for 30 seconds by applying 1000 W of microwave power (2.45 GHz) to the remote plasma. Then native oxides are reduced in the features by treatment for 30 seconds with radicals from a hydrogen plasma at a pressure of 350 to 450 mTorr with a hydrogen flow of 300 to 500 sccm and 600 to 1000 W of microwave power (2.45 GHz) to the remote plasma source.

An Alternative Embodiment

Figure 2:
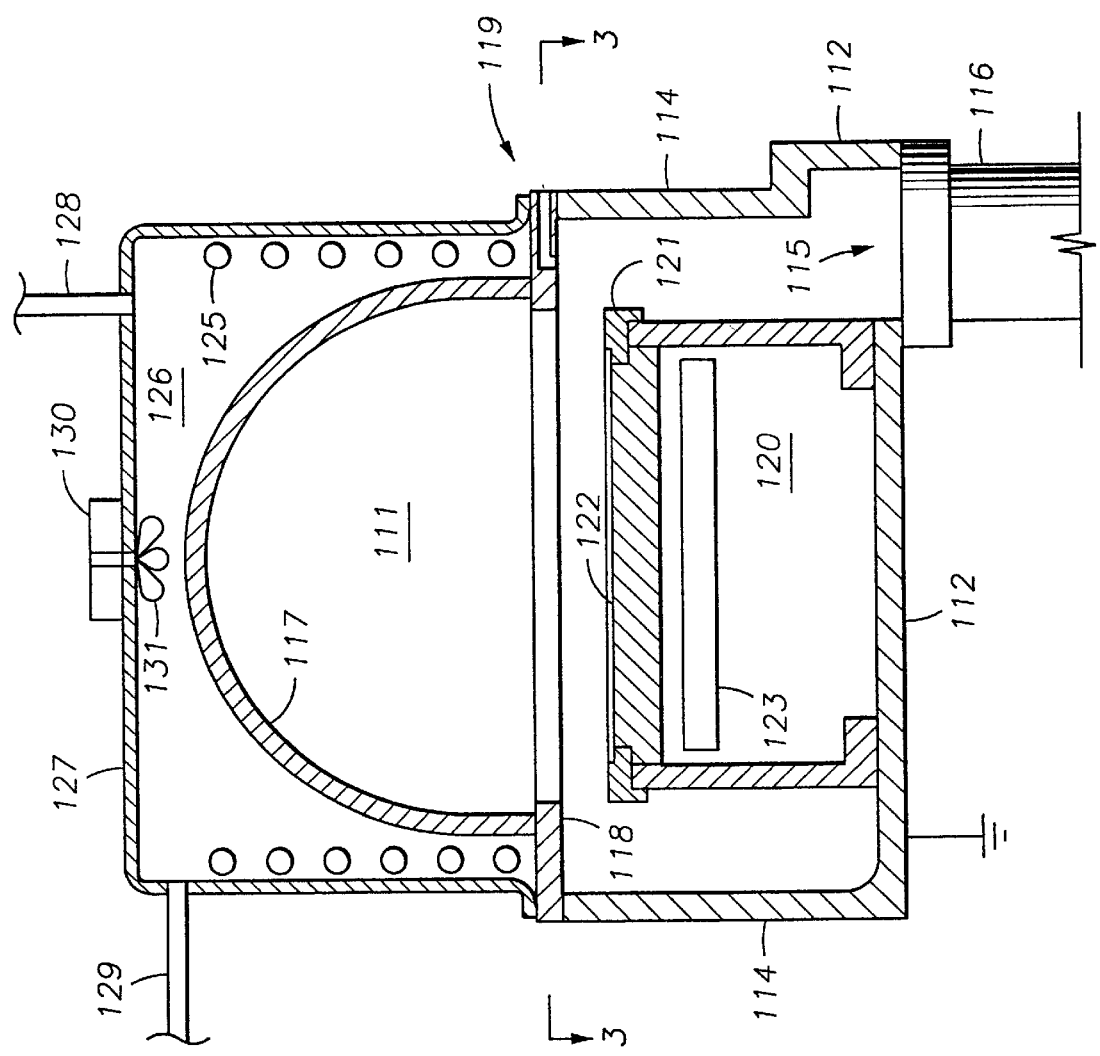
FIG. 2 shows the overall layout of an inductively coupled plasma reactor which generates a plasma to conduct the precleaning steps of the present invention.

Referring now to FIG. 2, an alternative processing chamber for conducting the process of the invention is shown schematically in a section view. The processing chamber can be a Preclean II chamber which is available from Applied Materials, Santa Clara, Calif. A vacuum chamber 111 is formed by a base member 112 having sidewalls 114 and which are preferably made of metallic construction such as stainless steel, aluminum or the like. An opening 115 in the base of the body member 112 is connected to a turbo pump 116 which is used to control the gas pressure inside the chamber 111. A quartz dome 117 forms the top of the chamber 111 and is provided with a flange 18 about its circumference where it mates with the top circumference of the sidewalls 114 of base member 112. A gas distribution system 119 is provided at the juncture of quartz dome 117 and base member 112 which will be discussed in more detail below. An insulating pedestal 120 made of quartz, ceramic or the like has a quartz cover 121 holding down a conductive pedestal 122 which is arranged to hold a wafer in the chamber 111. A high frequency RF power supply 123 is capacitively coupled to the pedestal 122 and supplies a negative bias voltage thereto. This bias voltage is not used during the precleaning steps of the present invention.

A helical shaped RF induction coil 125 is wound exteriorly to quartz dome 117 and is supported by the cover 127. The coil 125 is formed of hollow copper tubing. An alternating axial electromagnetic field is produced in the chamber 111 interiorly to the windings of the coil 125. Generally, an RF frequency of from about 350 KHz to about 450 KHz is employed and an RF power supply of conventional design (not shown) operating at this frequency is coupled to the coil 125 by a matching network (not shown) to generate a plasma in the chamber 111. The RF electromagnetic field generates a glow discharge plasma within the portion of the chamber 111 above the pedestal 122 which has a plasma sheath or dark space separating the plasma from the pedestal and the wafer.

Referring now to FIGS. 3 and 4, the gas distribution system for the reactant gas used in the system is shown in more detail, but still schematically. The top of the metallic sidewall member 114 has a gas supply trench 133 milled therein and twelve evenly spaced (angularly) disposed channels extending from a gas source intersect the channel to form a plurality of gas injection holes 132. When the flange 118 of quartz dome 117 is placed over the sidewalls 114 of the base member 112, a closed toroidal tube is formed in the space provided by the groove 133 and capped or topped by the flange 118 of dome 117. The reactant gas (usually fluorine or the like) is thus supplied at about the midpoint of the chamber 111 and is uniform in its flow across the wafer.

EXAMPLE

The precleaning steps of the present invention have been combined in the chamber shown in FIGS. 2–4 to successfully clean features etched in a dielectric layer having a copper sublayer prior to filling of the features with a Cu or Al plug. The chamber was stabilized for 5 seconds at a pressure of 5–20 mTorr with a mixture of 90% $H_2$ and 10% He, Ar, or $N_2$. The features were then cleaned for 60 seconds by applying 300 W of 400 KHz RF power to the coil and 10 W of RF power (13.56 MHZ) to the pedestal. These process conditions (i.e. with very low bias) can chemically reduce CuO without sputtering of the Cu sublayer onto the sidewalls. Similar treatment can also be used for Si or $TiSi_x$ sublayers at higher temperatures.

Integrated Processing System

The precleaning process of this invention is conducted in the dedicated precleaning chamber as described above, or done in situ in the barrier layer chamber. The precleaning chamber is preferably integrated with other moralization process chambers on a processing platform to avoid interim contamination of the substrates. A preferred integration scheme is shown in FIG. 5 which represents various processing chambers mounted on an ENDURA® platform available from Applied Materials, Inc.

Figure 5:
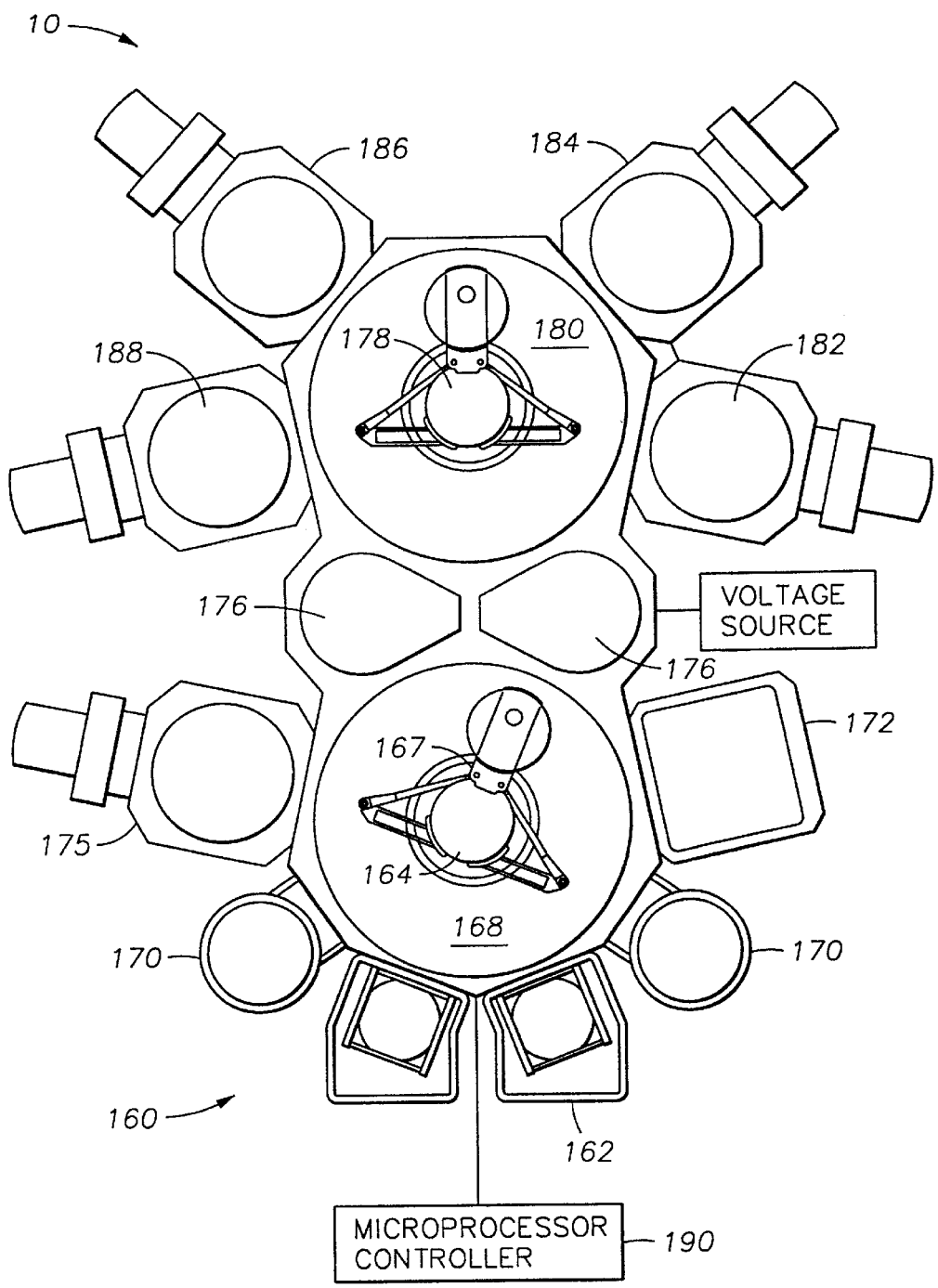
FIG. 5 shows an integrated processing platform configured to preclean and fill features on a semiconductor substrate according to the present invention.

Referring to FIG. 5, a schematic diagram shows an integrated processing system 160 having a RPS chamber for precleaning of the substrates and both PVD and CVD chambers thereon in which integrated moralization processes can be implemented. Typically, the substrates are introduced and withdrawn from the processing system 160 through a cassette loadlock 162. A robot 164 having a blade 167 is located within the processing system 160 to move the substrates through the system 160. A first robot 164 is typically positioned in a buffer chamber 168 to transfer substrates between the cassette loadlock 162, degas wafer orientation chamber 170, RPS preclean chamber 172, HP-PVD Ti/TiN chamber 175 and a cooldown chamber 176. A second robot 178 is located in transfer chamber 180 to transfer substrates to and from the cooldown chambers 176, a PVD IMP Ti/TiN chamber 182, a CVD Al Chamber 184, a CVD TiN chamber 186, and a PVD HTHU Al chamber 188. The transfer chamber 180 in the integrated system is preferably maintained at low pressure or high vacuum in the range of $10^{-8}$ torr. This specific configuration of the chambers in FIG. 5 comprise an integrated processing system capable of both CVD and PVD processes in a single cluster tool. This particular chamber configuration or arrangement is merely illustrative and more configurations of PVD and CVD processes are contemplated by the present invention.

Typically, a substrate processed in the processing system 160 is passed from the cassette loadlock 162 to the buffer chamber 168 where the robot 164 first moves the substrate into a degas chamber 170. The substrate is then be transferred into RPS preclean chamber 172, PVD HP TiN chamber 175, and then into a cooldown chamber 176. From the cooldown chamber 176, the robot 178 typically moves the substrate into and between one or more processing chambers before returning the substrate back to a cooldown chamber 176. It is anticipated that the substrate may be processed or cooled in one or more chambers any number of times in any order to fill the submicron features with aluminum. The substrate is removed from the processing system 160, following processing, through the buffer chamber 168 and then to the loadlock 162. A microprocessor controller 190 controls the sequence and formation of the layers on the substrates.

In accordance with the present invention, the processing system 160 passes a substrate through loadlock 162 into de-gas chamber 170 wherein the substrate is introduced to out gas contaminants. A substrate is then moved into the RPS pre-clean chamber 172 where the submicron features are cleaned to remove any contaminants thereon and to reduce native oxides. The substrate is then processed in the PVD HP Ti/TiN chamber 175 to deposit a Ti/TiN barrier layer on the cleaned dielectric surfaces, and then passed to a cooldown chamber 176. The second robot 178 then transfers the substrate to one or more CVD and PVD chambers for aluminum deposition.

The integrated platform 160 also enables a uniform and single phase deposition of titanium silicide by following the precleaning of a silicon sublayer with Ti deposition in the PVD IMP Ti/TiN chamber 182. After silicidation, warm Al, cool Al, or selective Al deposition completes the moralization of the submicron features.

Another application of the integrated platform of FIG. 5 provides for copper deposition by providing a CVD TiN chamber 175, a PVD γ-Cu chamber 182, a CVD Cu chamber 184, a PVD HTHU Cu chamber 186, and a PVD IMP Ta/TaN chamber 188. The substrate is processed in the CVD TiN chamber 175 or PVD IMP Ta/TaN chamber 188 to deposit a CVD TiN or Ta/TaN barrier layer on the cleaned dielectric surfaces, and then the substrate is passed to a cooldown chamber 176. Precleaning of submicron features prior to copper deposition can be performed in an RPS chamber 172 or in a Preclean II chamber which replaces a cooldown chamber 176. The Preclean II chamber modifies a cooldown chamber by addition of $H_2$, Ar, He, and $N_2$ plumbing. The second robot 178 then transfers the substrate to one or more CVD and PVD chambers for copper deposition. Deposited Cu layers may be annealed with $H_2$ to make the layer more resistant to formation of CuO.

Another application of the integrated platform of provides for tungsten deposition by providing a IMP Ti chamber, two CVD TiN chambers, and two preclean chambers. The substrate is processed in the IMP Ti and CVD TiN chambers to deposit Ti/TiN barrier layers on the cleaned dielectric surfaces, and then the substrate is passed to a cooldown chamber. Precleaning of submicron features prior to tungsten deposition can be performed in an RPS-based preclean chamber.

A staged-vacuum wafer processing method suitable for use with the present invention is disclosed in U.S. Pat. No. 5,186,718, entitled "Staged-Vacuum Wafer Processing System and Method," Tepman et al., issued on Feb. 16, 1993, which is hereby incorporated herein by reference. This method readily accommodates the precleaning method of this invention. Any combination of processing chambers can be used with the dedicated precleaning chamber.

While the foregoing is directed to preferred embodiments of the present invention, other and further embodiments of the invention may be devised without departing from the basic scope thereof. The scope of the invention is determined by the claims which follow.

What is claimed is:

1. A method of precleaning features formed in a dielectric layer on a semiconductor substrate, comprising:
    a) generating a plasma of a reactive gas in a remote plasma source, wherein the reactive gas is $He/NF_3$; and
    b) delivering radicals from the plasma of the reactive gas to a process chamber which contains a substrate having native oxides on a surface thereof.

2. The method of claim 1, wherein radicals from the plasma of the reactive gas is delivered to a barrier layer deposition chamber prior to deposition of a barrier layer.

3. The method of claim 2, wherein the radicals from the plasma of the reactive gas is delivered to a copper deposition chamber for passivation of the barrier layer prior to copper deposition.

4. The method of claim 2, wherein the barrier layer comprises Ti, TiN, Ta, TaN, or combinations thereof.

5. The method of claim 1, wherein the remote plasma source is a microwave source.

6. The method of claim 1, further comprising the step of reducing the native oxides with a plasma comprising hydrogen.

7. The method of claim 6, wherein the native oxide is reduced by a plasma consisting of hydrogen or a mixture of hydrogen and $N_2$, Ar, or He.

8. A method of forming features on semiconductor substrates, comprising:
    a) depositing a dielectric layer on a semiconductor substrate having a surface comprising a conductive or a semiconductive sublayer;
    b) etching features in the dielectric layer to expose the sublayer;
    c) cleaning the features with a plasma of a reactive gas which comprises $He/NF_3$, wherein the plasma is generated by a remote plasma source and radicals from the plasma are delivered to a chamber which contains the substrate; and
    d) filling the features with a conductive or semiconductive material.

9. The method of claim 8, wherein the dielectric layer comprises silicon dioxide.

10. The method of claim 8, wherein the reactive gas is a mixture of $CF_4/O_2$.

11. The method of claim 8, wherein a $TiSi_x$ layer is formed within the feature.

12. The method of claim 8, further comprising the step of reducing native oxides remaining in the features with a plasma comprising hydrogen with little or no bias power prior to filling of the features with copper.

13. The method of claim 8, further comprising the steps of depositing a barrier layer of TiN on the feature and cleaning the barrier layer with a plasma consisting of hydrogen, or a mixture of hydrogen and $N_2$, Ar, or He.

14. The method of claim 8, wherein the substrate surface comprises Ge, Si, Al, Cu, TiN, or doped silicon.

15. The method of claim 8, wherein the conductive material comprises Al, Cu, W, Ti, TiN, Ta, TaN, or combinations thereof.

16. The method of claim 8, wherein the conductive material comprises Al, Cu, or W.

17. The method of claim 8, wherein the semiconductive material comprises Ge, Si, silicon dioxide, doped silicon, or combinations thereof.

18. The method of claim 8, wherein the reactive gas is oxygen, a mixture of $He/NF_3$, or a combination thereof.

19. A method of precleaning features in a dielectric layer on a semiconductor substrate, comprising the steps of:
    a) cleaning the submicron features with a first plasma comprising a reactive gas;
    b) reducing native oxides remaining in the submicron features with a second plasma comprising hydrogen; and
    c) cleaning the barrier/liner layer with a plasma of a reactive gas which comprises $He/NF_3$.

20. The method of claim 19, wherein the reactive gas is a mixture of $CF_4/O_2$.

21. The method of claim 19, further comprising the step of depositing a barrier/liner layer on exposed surfaces of the dielectric layer, wherein the barrier/liner layer comprises a material selected from the group consisting of titanium, titanium nitride, tantalum, and tantalum nitride.

22. The method of claim 19, further comprising the step of depositing aluminum, copper, or tungsten on the barrier/liner layer.

23. The method of claim 19, wherein the plasma is generated in a remote plasma source and radicals from the plasma are delivered to a barrier layer deposition chamber in which contains the substrate prior to deposition of the barrier layer.

24. The method of claim 19, wherein the plasma is generated in a remote plasma source and radicals from the plasma are delivered to a copper deposition chamber for passivation of a barrier layer prior to copper deposition.

25. The method of claim 19, wherein the reactive gas comprises oxygen, a mixture of $He/NF_3$, a mixture of $CF_4/O_2$, or a mixture thereof.

26. A method for precleaning surfaces of a substrate having native oxides thereon, comprising:
   a) generating a plasma of reactive gas in a remote plasma source, wherein the reactive gas comprises $He/NF_3$; and
   b) delivering radicals from the plasma to a process chamber which contains the substrate having native oxides.

27. The method of claim 26, wherein the reactive gas consists essentially of a fluorine-containing compound.

28. The method of claim 26, further comprising generating a second plasma comprising hydrogen and cleaning remaining oxides on the substrate.

29. The method of claim 28, wherein the second plasma further comprises $N_2$, Ar, He, or mixtures thereof.

30. A method for pre-cleaning surfaces of a substrate having native oxides, comprising:
   a) generating a plasma of reactive gas comprising $He/NF_3$ in a remote plasma source; and
   b) delivering the plasma to a process chamber which contains the substrate having native oxides.

31. The method of claim 30, wherein the reactive gas further comprises oxygen or an oxygen-containing compound.

32. The method of claim 30, wherein the reactive gas consists essentially of $He/NF_3$.

33. The method of claim 30, further comprising generating a second plasma comprising hydrogen and cleaning remaining oxides on the substrate.

34. A method for pre-cleaning surfaces of a substrate having native oxides, comprising:
   a) generating a plasma of reactive gas comprising $He/NF_3$ in a remote plasma source;
   b) cleaning the substrate having native oxides formed thereon; and then
   c) depositing a conductive or semiconductive material on the substrate.

35. The method of claim 34, further comprising generating a second plasma comprising hydrogen and cleaning remaining oxides on the substrate.

36. A method for cleaning surfaces of a substrate having native oxides, comprising:
   a) generating a first plasma of reactive gas comprising $He/NF_3$;
   b) removing the native oxides from the substrate surfaces;
   c) generating a second plasma comprising hydrogen; and
   d) removing any remaining native oxides from the substrate surfaces.

37. The method of claim 36, wherein the substrate surfaces comprise Ti, TiN, Ta, TaN, or combinations thereof.

38. The method of claim 36, wherein the substrate surfaces comprise Ge, Si, Al, Cu, W, TiN, or doped silicon.

39. The method of claim 38, wherein the substrate surfaces comprise Al, Cu, or W.

40. The method of claim 36, wherein the first and second plasmas are generated in a remote plasma source.

41. The method of claim 36, wherein the second plasma further comprises $N_2$, Ar, He, or mixtures thereof.

42. A method for pre-cleaning surfaces of a substrate having native oxides, comprising:
   a) generating a first plasma of reactive gas comprising $He/NF_3$;
   b) delivering radicals from the first plasma to a process chamber which contains the substrate having native oxides;
   c) generating a second plasma of reactive gas comprising hydrogen in the remote plasma source; and
   d) delivering radicals from the second plasma to the process chamber which contains the substrate having native oxides.

43. The method of claim 42, further comprising depositing a conductive or semiconductive material on the substrate.

44. The method of claim 43, wherein the conductive material comprises Al, Cu, W, Ti, TiN, Ta, TaN, or combinations thereof.

45. The method of claim 44, wherein the conductive material comprises Al, Cu, or W.

46. The method of claim 43, wherein the semiconductive material comprises Ge, Si, silicon dioxide, doped silicon, or combinations thereof.

47. The method of claim 42, wherein the substrate surface comprises Ge, Si, Al, Cu, W, TiN, or doped silicon.

48. The method of claim 42, wherein the second plasma further comprises nitrogen, argon, helium, or combinations thereof.

49. A method for cleaning surfaces of a substrate having native oxides, comprising:
   a) removing the native oxides using radicals from a first plasma of reactive gas comprising oxygen, a mixture of $CF_4/O_2$, a mixture of $He/NF_3$, or a mixture thereof;
   b) depositing a barrier layer on the feature;
   c) removing the native oxides using radicals from a second plasma of reactive gas comprising oxygen, a mixture of $CF_4/O_2$, a mixture of $He/NF_3$, or a mixture thereof; and
   d) depositing a metal layer on the barrier layer.

50. The method of claim 49, further comprising removing any remaining native oxides using a third plasma comprising hydrogen.

51. The method of claim 50, wherein the third plasma further comprises $N_2$, Ar, He, or mixtures thereof.

52. The method of claim 49, wherein the barrier layer is deposited without breaking vacuum.

53. The method of claim 49, wherein the metal layer is deposited without breaking vacuum.

54. The method of claim 49, wherein both the barrier layer and the metal layer are deposited without breaking vacuum.

55. A method for cleaning surfaces of a substrate having native oxides, comprising:
   a) removing the native oxides using radicals from a first plasma of reactive gas comprising oxygen, a mixture of $CF_4/O_2$, a mixture of $He/NF_3$, or a mixture thereof;

b) removing any remaining native oxides using a second plasma comprising hydrogen;

c) depositing a barrier layer on the feature;

d) removing the native oxides using radicals from a third plasma of reactive gas comprising oxygen, a mixture of $CF_4/O_2$, a mixture of $He/NF_3$, or a mixture thereof;

e) removing any remaining native oxides using a fourth plasma comprising hydrogen; and f) depositing a metal layer on the barrier layer.

56. The method of claim 55, wherein the second and fourth plasmas further comprise $N_2$, Ar, He, or combinations thereof.

57. The method of claim 55, wherein the barrier layer is deposited without breaking vacuum.

58. The method of claim 55, wherein the metal layer is deposited without breaking vacuum.

59. The method of claim 55, wherein both the barrier layer and the metal layer are deposited without breaking vacuum.

* * * * *